United States Patent [19]

Reichert

[11] 4,374,392
[45] Feb. 15, 1983

[54] MONOLITHIC INTEGRATED CIRCUIT INTERCONNECTION AND FABRICATION METHOD

[75] Inventor: Walter F. Reichert, East Brunswick, N.J.

[73] Assignee: RCA Corporation, New York, N.Y.

[21] Appl. No.: 210,250

[22] Filed: Nov. 25, 1980

[51] Int. Cl.³ ............................................. H01L 29/78
[52] U.S. Cl. .......................................... 357/23; 357/4; 357/41; 357/58; 357/68; 357/65; 357/15
[58] Field of Search ................. 357/23 TF, 4, 65, 68, 357/58, 15, 41

[56] References Cited

U.S. PATENT DOCUMENTS

| | | | |
|---|---|---|---|
| 3,593,068 | 2/1971 | Rosler | 357/65 |
| 3,641,661 | 2/1972 | Canning | 357/65 X |
| 4,141,021 | 2/1979 | Decker | 357/4 X |
| 4,226,649 | 10/1980 | Darey | 357/15 X |

OTHER PUBLICATIONS

Bolzer et al., IEEE Trans. on Electron Devices, vol. ED-27, No. 6, Jun. 1980.

*Primary Examiner*—Martin H. Edlow
*Attorney, Agent, or Firm*—Birgit E. Morris; Donald S. Cohen; Kenneth R. Glick

[57] ABSTRACT

A monolithic integrated circuit incorporates a substrate of III-V material having an interconnection pattern disposed on a surface thereof. An epitaxial layer is grown on the substrate surface such that it overgrows the interconnection pattern, and a plurality of circuit elements, formed on the surface of the epitaxial layer, are interconnected by contacts which extend from the epitaxial layer surface to the underlying interconnection pattern.

7 Claims, 4 Drawing Figures

MONOLITHIC INTEGRATED CIRCUIT INTERCONNECTION AND FABRICATION METHOD

The U.S. Government has rights in this invention pursuant to Contract No. 79-6354.

BACKGROUND OF THE INVENTION

The present invention relates to a method and to a structure for interconnecting various elements in a monolithic integrated circuit. More particularly, it relates to a buried metallization structure in a GaAs substrate.

The term monolithic integrated circuit generally refers to an integrated circuit in which substantially all active, passive and interconnection elements are disposed on a single semiconductor substrate. Various circuit elements are typically interconnected by metallized lines and crossovers on a surface of the substrate. However, as the number of circuit elements and the complexity of the circuit increase, crossover design constraints impose limitations on the circuit layout. In an effort to minimize these constraints as well as the problems associated with crossover fabrication, the present invention has been devised.

The invention provides a means for interconnecting the circuit elements of a GaAs device, the interconnecting means being internal to the GaAs device substrate.

SUMMARY OF THE INVENTION

A monolithic integrated circuit incorporates a substrate of III-V material having a substantially planar surface. An interconnection pattern is disposed on the substrate surface and an expitaxial layer is disposed across both the substrate surface and the interconnection pattern. Electrical contact is made to selected portions of the interconnection pattern, the contacts extending through the epitaxial layer.

DETAILED DESCRIPTION

Figure 1:
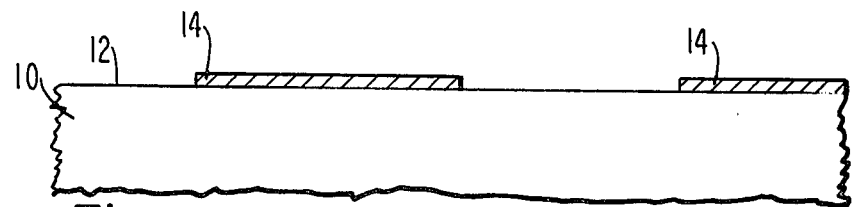
FIGS. 1-4 illustrate a process sequence for fabricating an interconnection of the present invention, FIG. 4 representing an exemplary embodiment of the invention in a field effect transistor.

The starting point for the fabrication process of the present invention is a single crystalline substrate 10 having a substantially planar surface 12, as illustrated in FIG. 1. In the preferred embodiment, the substrate 10 is GaAs, although it is expected that other III-V semiconductor compounds, as well as ternary or quaternary compounds, would be suitable as well. Semi-insulating GaAs is a frequently used substrate material for semiconductor devices which are to be operated at high (e.g. RF, microwave) frequencies, and devices made by the process described herein are particularly suitable for such applications.

A relatively thin interconnection pattern 14 or plurality of patterns 14 is disposed on the planar surface 12. Each pattern 14 comprises a refractory metal layer approximately 100 to 1000 Angstroms in thickness and is appropriately shaped so as to form an electrical path between particular elements of the circuit being fabricated. A refractory material is chosen because of its ability to withstand subsequent processing steps, and both tungsten and molybdenum have been successfully used. The pattern(s) 14 can be formed using conventional vacuum deposition and photolithographic pattern generation techniques.

Figure 2:
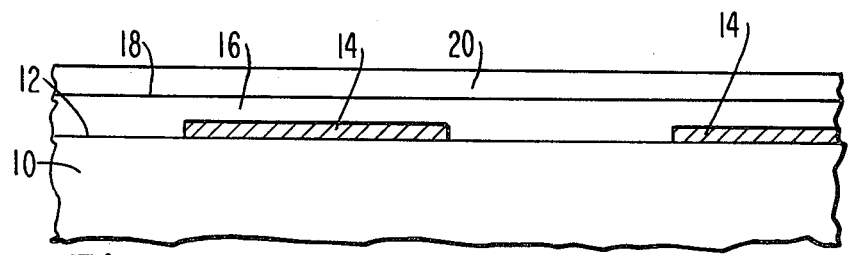

As illustrated in FIG. 2, an expitaxial layer 16 is then grown on the substrate surface 12 such that it also covers the interconnection patterns 14. An example of this process, which can be referred to as an epitaxial overgrowth technique, is described in FABRICATION AND NUMERICAL SIMULATION OF THE PERMEABLE BASE TRANSISTOR, C. O. Bozler et al., IEEE Transactions, Vol. ED-27, No. 6, June 1980. In the preferred embodiment of the present invention, the epitaxial layer 16 is electrically insulating (also referred to as semi-insulating), containing less than approximately $10^{15}$ carriers/cm$^3$. This layer 16, conventionally referred to as a buffer layer, is typically of relatively high purity and it provides a uniform surface 18 of relatively high crystallographic quality to serve as a basis for further processing. It is important to recognize that the buffer layer 16 is single crystalline (and hence insulating) throughout. That portion disposed over the interconnection pattern 14, as well as that portion disposed directly on the surface 12, are single crystalline material. In the preferred embodiment, the substrate 10 and buffer layer 16 are GaAs; however, other suitable III-V materials which epitaxially grow in a similar single crystalline manner can be substituted for the substrate or the buffer.

An active layer 20 is then formed on the surface 18 of the buffer layer 16. In the illustrated embodiment, the active layer 20 is disposed over the entire surface 18; however, it should be understood that alternatively the active layer can be selectively formed on predetermined areas of the surface 18. The active layer 20 can also be epitaxially grown, and it is typically doped with a conductivity modifier so as to yield, for example, an N type GaAs layer having greater than approximately $10^{17}$ carriers/cm$^3$. In the preferred embodiment, appropriate thicknesses for the buffer layer 16 and active layer 20 are approximately 2 microns and 1 micron, respectively, although the thicknesses can be readily varied without affecting the invention.

Figure 3:
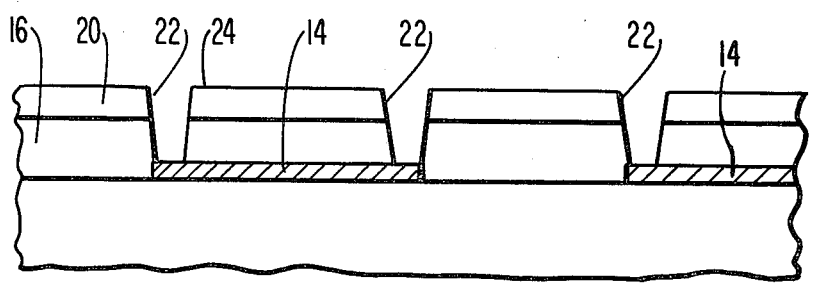

Openings 22 are then formed in the active and buffer layers 20 and 16, as illustrated in FIG. 3. Although, in the alternate case of a selectively formed active layer 20, it may only be necessary to form openings in the buffer layer 16, the openings 22 are located such that they extend from the exposed surface 24 of the active layer 20 to selected portions of the interconnection patterns 14, and they can be formed by conventional processing such as selective chemical etching or ion or electron beam milling.

Figure 4:
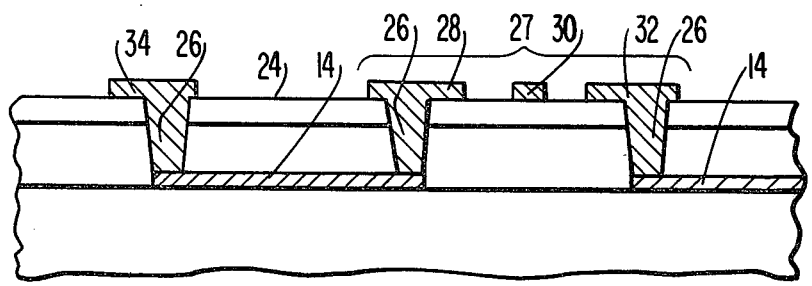

As illustrated in FIG. 4, contacts 26 are next deposited in the openings 22 so as to electrically connect the patterns 14 to the active layer surface 24. In this exemplary embodiment, an FET 27 which includes spaced source, gate and drain electrodes, 28, 30 and 32 respectively, is fabricated on the surface 24 such that the source and drain electrodes 28 and 32 are each connected (via a contact 26) to a particular interconnection pattern 14. The interconnection pattern 14 to which the source electrode 28 is connected is further connected, via contact 26, to a fourth electrode 34 on the surface 24. This fourth electrode 34 might, for examlple, be an electrode for a second FET or a bond pad. Additionally, the drain electrode 32 of FET 27 might be similarly interconnected to other circuit elements via the interconnection pattern 14 which it contacts.

The described electrodes 28, 30, 32 and 34 can be generated on the active layer surface 24 by standard deposition and photolithographic methods. Alternatively, when fabricating an FET, the electrode deposition technique described in copending U.S. patent application Ser. No. 113,213, filed Mar. 12, 1980, ELECTRODE FOR A PLANAR HIGH FREQUENCY POWER FET, by W. F. Reichert et al., can be used. With this alternative technique, the contacts 26 to the source and drain electrodes 28 and 32 are deposited so as to form low resistance ohmic contacts with opposing wall surfaces of the openings 22 in the active layer 20. Additionally, it should be recognized that although the embodiment illustrated in FIG. 4 shows an FET structure, the present invention is not so limited. The interconnection patterns 14 can be far more complex, and the contacts 26 can be connected to any number of a variety of circuit elements.

What is claimed is:

1. A monolithic integrated circuit, comprising:
   a substrate of III-V material having a surface;
   an interconnection pattern disposed on the substrate surface;
   an epitaxial layer disposed on the substrate surface and the interconnection pattern; and
   a plurality of circuit elements disposed on the epitaxial surface, each element having a portion which contacts the interconnection pattern.
2. A circuit in accordance with claim 1, wherein:
   the substrate is GaAs.
3. A circuit in accordance with claim 1, wherein:
   the interconnection pattern comprises a relatively thin film of a refractory material.
4. A circuit in accordance with claim 3, wherein:
   the refractory metal is selected from the group consisting of molybdenum and tungsten.
5. A circuit in accordance with claim 1, wherein:
   the circuit elements contact the interconnection pattern via metallized openings in the epitaxial layer.
6. A circuit in accordance with claim 1, wherein:
   the epitaxial layer includes a buffer layer disposed on the substrate surface and an active layer disposed on the buffer layer.
7. A circuit in accordance with claims 1 or 6, further comprising:
   an FET having spaced source, gate and drain electrodes on the epitaxial layer;
   the source electrode contacting a first interconnection pattern; and
   the drain electrode contacting a second interconnection pattern.

* * * * *